Aug. 11, 1970 A. A. VALDETTARO 3,524,142

AMPLIFIER NEUTRALIZATION DEVICE

Filed May 15, 1968

INVENTOR:

ALARICO A. VALDETTARO

BY

Mason, Kolehmainen, Rathburn & Wyss

ATT'YS 3,524,142
AMPLIFIER NEUTRALIZATION DEVICE

Alarico A. Valdettaro, Bloomington, Ind., assignor to Sarkes Tarzian, Inc., Bloomington, Ind., a corporation of Indiana Filed May 15, 1968, Ser. No. 729,264
Int. Cl. H03f *1/14*
U.S. Cl. 330—27 8 Claims

ABSTRACT OF THE DISCLOSURE

A bridge neutralized radio frequency amplifier is improved by the addition of a neutralizing adjustment gimmick wire that is fastened to one electrode of the amplifying device and can be positioned adjacent either one of two adjoining arms of the bridge.

The present invention relates to amplifiers, and more particularly to neutralized high frequency amplifiers.

It is customary to neutralize radio frequency amplifiers to insure maximum gain without regeneration. Neutralization is usually accomplished by coupling the amplifier input and output circuits across opposing diagonals of a balanced electrical bridge. The electrical paths coupling the input and output signals then balance out, and the only coupling between the two circuits is the signal generated by the amplifying device. To insure a precise balance of the interconnecting bridge, it is customary to include at least one variable element in the bridge, usually a capacitor, which can be adjusted to give maximum decoupling between the amplifier input and output circuits.

In frequency modulation receivers and television receivers designed for the retail market, this adjustable element is usually a gimmick wire that extends along a path adjacent and parallel to a lumped capacitive element of the bridge. By shifting this gimmick wire while monitoring the coupling between the input and output circuits it is usually possible to achieve proper neutralization.

The range of capacity variation afforded by this device is very small, however, and often it is not possible for this device to compensate for variations in the capacity of other bridge elements. When such a conventional gimmick wire device is used in amplifiers that are mass produced, it is not uncommon for amplifiers to appear in production that cannot be neutralized. Since alternative neutralization adjusting arrangements utilizing a conventional variable capacitor are too expensive for use in amplifiers designed for the retail market, the gimmick wire neutralizing arrangement continues to be used in spite of its shortcomings, and the unneutralizable amplifiers which appear are generally sold along with the properly neutralized amplifiers.

It is a primary object of the present invention to provide an improved gimmick wire neutralization device that is able to supply a sufficient range of capacity variation to compensate for variations in the capacity of other bridge elements, and that is therefore able to neutralize any amplifier that may be encountered in a commercial production situation.

Briefly, the present invention resides in the use of a gimmick wire that is connected to one electrode of the amplifying device and is adapted to be positioned adjacent another electrode of the amplifying device. The gimmick wire thus varies the interelectrode capacity, which is of a much smaller value then the conventional fixed capacitor with which a gimmick wire is normally employed, and hence the effect of variation of the gimmick wire position has an effect which is many times greater than the effect of gimmick wire movement in a conventional fixed capacitor arrangement. As a result, the range of adjustment for neutralization purposes is greatly extended. In a preferred embodiment, the range may be extended even further by connecting the gimmick wire so that it can be positioned either adjacent another electrode of the amplifying device, to increase the interelectrode capacity, or may be positioned adjacent the fixed neutralization capacitor to increase the value thereof. These variations have an opposite effect on neutralization and hence the range of adjustment for neutralization purposes is greatly increased.

The invention, both as to its organization and method of operation, together with further objects and advantages thereof, will best be understood by reference to the following specification taken in connection with the accompanying drawings in which.

Figures 2, 3:
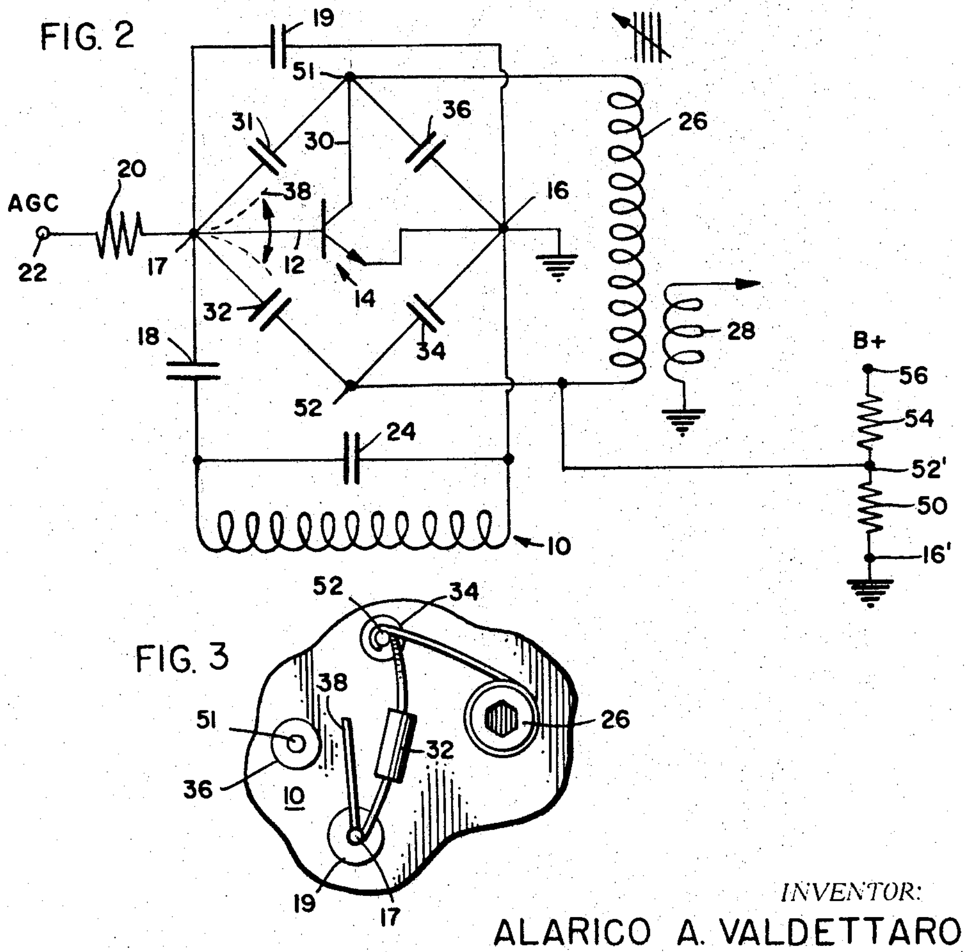
FIG. 2 is a schematic diagram of the amplifier shown in FIG. 1.
FIG. 3 is a simplified plan view of the amplifier shown in FIG. 1.

Referring now to the drawings, there is illustrated in FIG. 2 a schematic diagram of a one transistor amplifier designed in accordance with the present invention. The amplifier is a mixer-amplifier designed for use in the frequency convertor stage of a television receiver, although it could just as well be used as a radio frequency or intermediate frequency amplifier if the input and output circuits were appropriately returned. An input signal is supplied to an input coil 10 and capacitor 24 by suitable inductive or capacitive signal transmitting means (not shown) and is transferred to a node 17 through a capacitor 18. The input signal thus appears between the node 17 and a ground potential node 16.

The amplifier output signal appears between a node 51 and a node 52, and is applied to a coil 26. The coil 26 includes a secondary output coil 28 that connects to an intermediate frequency amplifier (not shown).

A base electrode 12 of transistor 14 connects to the node 17, and a collector electrode 30 connects to the node 51. The emitter of the transistor 14 is connected to the ground node 16. Automatic gain control (AGC) current flows from a node 22 through a resistor 20 to the node 17 and to the base electrode 12. Collector current flows from a node 52' through the coil 26 to the node 51 and to the collector electrode 30. The node 52' is connected to a source of positive potential 56 by a resistor 54 and to a ground node 16' by a resistor 50.

The input and output signals are interconnected by a balanced bridge comprising the four capacitors 31, 32, 34, and 36. The capacitor 31 is the base-collector capacitance of the transistor 14. The capacitors 34 and 36 are feed-through capacitors and the neutralizing capacitor 32 is a tubular capacitor.

In accordance with the principles of the present invention, a gimmick wire 38 is attached to the node 17 and is positionable either towards the node 51, i.e., the collector of the transistor 14 to increase the interelectrode capacity thereof, or toward the neutralizing capacitor 32. This gimmick wire 38 is shown in FIG. 3. The node 51 is actually the center terminal of the feed-through capacitor 36. The tubular capacitor 32 is connected between the center terminals of the feed-through capacitor 19 and of the feed-through capacitor 34. In FIG. 3, the gimmick wire 38 is positioned midway between the node 51 and the capacitor 32. If more negative feedback is required for proper neutralization, the gimmick wire 38 is shifted towards the node 51. If more positive feedback is required for proper neutralization the gimmick wire 38 is shifted towards the capacitor 32. In this manner, the gimmick wire 38 can add capacity to either adjacent arm of the capacitive bridge. Enough capacity variation is provided by this arrangement to allow full neutralization of any amplifier, even one constructed from parts that are somewhat out of tolerance.

Figure 1:
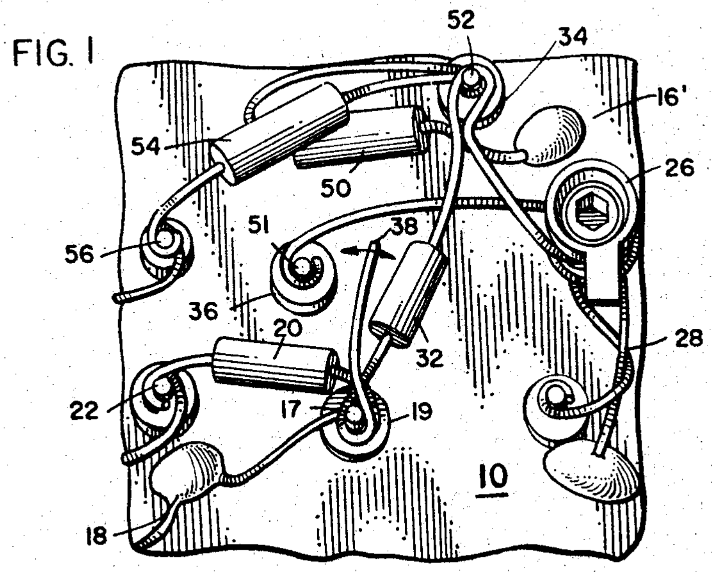
FIG. 1 is a plan view of an amplifier embodying the present invention.

FIG. 1 shows the complete amplifier. The transistor 14 is on the other side of the metal chassis 10, and is not visible in FIG. 1. The transistor base 12 and collector 30 are connected respectively to the center terminals of the feed-through capacitors 19 and 36, the outer conductive sleeve of said capacitors being connected to the chassis 10 in a conventional manner. The primary of the coil 26 is connected to the center terminals of the capacitors 34 and 36 on the same side of the tuner chassis as the capacitor 32. The coil 10 and the capacitor 24 are not shown in FIG. 1.

In some instances the neutralizing capacitor 32 may not be conveniently positioned so as to permit the gimmick wire 38 to be moved between node 51 and capacitor 32. In those instances, the gimmick wire 38 is preferably positioned so that it can be moved close to the node 51 and hence cause a relatively large change in the base-collector capacitance of the transistor 14. This change will be many times greater than the percentage capacity change which results when the gimmick wire 38 is moved toward the neutralizing capacitor 32. As a result, the range of neutralization afforded by movement of the gimmick wire 38 to vary interelectrode capacity is substantially greater than that provided in prior art arrangements and may in many instances be sufficient to provide adequate neutralization for a particular design of tuner.

By way of example, only the following component values have been found to be satisfactory in the illustrated amplifier circuit arrangement:

Resistor 20—18,000 ohms
Resistor 50—39,000 ohms
Resistor 54—2,700 ohms
Capacitor 18—15 picofarads
Capacitor 19—33 picofarads
Capacitor 32—3 picofarads
Capacitor 34—39 picofarads
Capacitor 36—10 picofarads
Transistor 34—NPN type While a preferred embodiment of the invention as applied to a transistor mixer amplifier has been shown, it is to be understood that the invention as defined in the appended claims is also applicable to other types of amplifiers, including vacuum tube amplifiers, and that different embodiments of the present invention will usually be required to satisfy the special requirements of such other types of amplifiers. It is also to be understood that various modifications and changes may be made in the embodiment shown without departing from the true spirit and scope of the invention.

What is claimed as new and is desired to be secured by Letters Patent of the United States is:

1. An amplifier having an input circuit and an output circuit interconnected by a multi-branched balanced electrical bridge, wherein the improvement comprises a gimmick wire connected to one corner of said bridge and positionable to increase the capacity of either adjacent branch of said bridge.

2. An amplifier that includes an input and output circuit interconnected by a four-armed balanced electrical bridge, and that further includes an amplifying device having an input electrode connected to the input circuit and an output electrode connected to the output circuit, wherein the improvement comprises a gimmick wire connected to one of said electrodes and positionable to increase the capacity of either adjacent arm of the bridge.

3. An amplifier that includes an amplifying device having an input electrode and an output electrode, an input circuit connected to the input electrode, an output circuit connected to the output electrode, and a four-armed balanced capacitive bridge interconnecting said input and output circuits, one arm of said bridge being the capacity between said electrodes and the remaining arms of said bridge being fixed capacitors, wherein the improvement comprises a gimmick wire connected to one of said electrodes and positionable to increase the capacity of either adjacent arm of the bridge.

4. An amplifier that includes an amplifying device having an input electrode and an output electrode, an input circuit connected to the input electrode, an output circuit connected to the output electrode, and a four-armed balanced capacitive bridge interconnecting said input and output circuits, one arm of said bridge being the capacity between said electrodes and the remaining arms of said bridge being fixed capacitors, wherein the improvement comprises a gimmick wire connected to one of said electrodes and positionable to increase or decrease the capacity between said electrodes.

5. An amplifier that includes an amplifying device having an input electrode and an output electrode, an input circuit connected to the input electrode, an output circuit connected to the output electrode, and a four-armed balanced capacitive bridge interconnecting said input and output circuits, one arm of said bridge being the capacity between said electrodes and the remaining arms of said bridge being fixed capacitors, wherein the improvement comprises a gimmick wire connected to one of said electrodes, said gimmick wire being positionable to be near the other of said electrodes and also positionable to be near the fixed capacitor connected to said one electrode.

6. An amplifier that includes an amplifying device having an input electrode and an output electrode, an input circuit connected to the input electrode, an output circuit connected to the output electrode, and a four-armed balanced capacitive bridge interconnecting said input and output circuits, one arm of said bridge being the capacity between said electrodes and the remaining arms of said bridge being fixed capacitors, wherein the improvement comprises a gimmick wire connected to one of said electrodes and adapted to be positioned near the other of said electrodes.

7. A bridge neutralized transistor amplifier comprising:

a conductive chassis;

first and second feed-through capacitors mounted on said chassis so as to each have a center conductor providing a first terminal on a first side of said chassis and a second terminal on a second side of said chassis;

a third capacitor having first and second terminals, and mounted on the chassis with its second terminal connecting to the chassis, a neutralizing capacitor connected between the first terminals of said first and third capacitors, having a capacity that approximately neutralizes the amplifier;

means for supplying an input signal connected between the first terminal of said third capacitor and ground;

means for extracting an output signal connected between the first terminals of said first and second capacitors;

a transistor mounted on the second side of said chassis, having an input electrode connected to the first terminal of said third capacitor and having an output electrode connected to the second terminal of said second capacitor, and having a third terminal connected to the chassis for high frequency signals; and a gimmick wire connected to the first terminal of said third capacitor and positionable adjacent both the body of said neutralizing capacitor and the first terminal of said second capacitor.

8. A bridge neutralized transistor amplifier in accordance with claim 7 wherein the third capacitor is also a feed-through capacitor mounted in said chassis and having a center conductor which forms its first terminal on a first side of said chassis and a third terminal on a second side of said chassis, and wherein the second terminal of said capacitor is an outer ring that is connected to said chassis.

References Cited

UNITED STATES PATENTS 1,763,015 6/1930 Stevenson ----------- 330—76

OTHER REFERENCES

Garner: Transistor Circuit Handbook, published by Coyne Electrical School, Chicago, Ill., pp. 84–85.

ROY LAKE, Primary Examiner

J. B. MULLINS, Assistant Examiner

U.S. Cl. X.R.

330—78